(12) United States Patent
Meyer et al.

(10) Patent No.: US 7,759,792 B2
(45) Date of Patent: Jul. 20, 2010

(54) INTEGRATED CIRCUIT INCLUDING PARYLENE MATERIAL LAYER

(75) Inventors: Thorsten Meyer, Regensburg (DE);
Markus Brunnbauer, Lappersdorf (DE); Stephan Bradl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 84 days.

(21) Appl. No.: 11/839,129

(22) Filed: Aug. 15, 2007

(65) Prior Publication Data
US 2009/0045511 A1   Feb. 19, 2009

(51) Int. Cl.
*H01L 23/04* (2006.01)
(52) U.S. Cl. .................. 257/730; 257/E23.021
(58) Field of Classification Search ........... 257/779, 257/780, 738, E23.021
See application file for complete search history.

(56) References Cited

U.S. PATENT DOCUMENTS

| | | | |
|---|---|---|---|
| 6,181,569 B1 | 1/2001 | Chakravorty | |
| 6,350,668 B1 | 2/2002 | Chakravorty | |
| 6,560,377 B2 | 5/2003 | Jones et al. | |
| 6,908,784 B1 | 6/2005 | Farnworth et al. | |
| 6,964,915 B2 | 11/2005 | Farnworth et al. | |
| 7,029,949 B2 | 4/2006 | Farnworth et al. | |
| 7,064,010 B2 | 6/2006 | Farnworth et al. | |
| 7,498,196 B2 * | 3/2009 | Lee et al. | 438/108 |
| 2004/0113283 A1 * | 6/2004 | Farnworth et al. | 257/782 |
| 2005/0121804 A1 * | 6/2005 | Kuo et al. | 257/781 |
| 2006/0173497 A1 | 8/2006 | Mech et al. | |

\* cited by examiner

*Primary Examiner*—David A Zarneke
*Assistant Examiner*—Jenny L Wagner
(74) *Attorney, Agent, or Firm*—Dicke, Billig & Czaja, PLLC

(57) ABSTRACT

An integrated circuit includes a substrate including a contact pad, a redistribution line coupled to the contact pad, and a dielectric material layer between the substrate and the redistribution line. The integrated circuit includes a solder ball coupled to the redistribution line and a parylene material layer sealing the dielectric material layer and the redistribution line.

10 Claims, 4 Drawing Sheets

INTEGRATED CIRCUIT INCLUDING PARYLENE MATERIAL LAYER

BACKGROUND

Bare dye or wafer level packages include a redistribution layer (RDL) for Touting signals from the internal circuitry of an integrated circuit to external solder balls. The redistribution layer must be protected against oxidation and corrosion to ensure the integrity of the integrated circuit. Typically, the redistribution layer is protected from oxidation and corrosion using expensive special process flows.

For example, one type of wafer level package includes special metal stacks, such as Cu, Ni, and Au to protect the redistribution layer from oxidation and corrosion. The special metal stacks require large throughput, however, and the final layer of the metal stack needs to be a noble metal. Additional materials such as a solder stop material layer deposited on top of the noble material, however, do not adhere well to the noble material.

Other types of wafer level packages use special geometries to avoid oxidation and corrosion of the redistribution layer. Geometrical adaptations can be realized by separation of the redistribution layer and under bump metallization (UBM). The use of special geometries requires additional photolithography steps and therefore increases the cost.

For these and other reasons, there is a need for the present invention.

SUMMARY

One embodiment provides an integrated circuit. The integrated circuit includes a substrate including a contact pad, a redistribution line coupled to the contact pad, and a dielectric material layer between the substrate and the redistribution line. The integrated circuit includes a solder ball coupled to the redistribution line and a parylene material layer sealing the dielectric material layer and the redistribution line.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
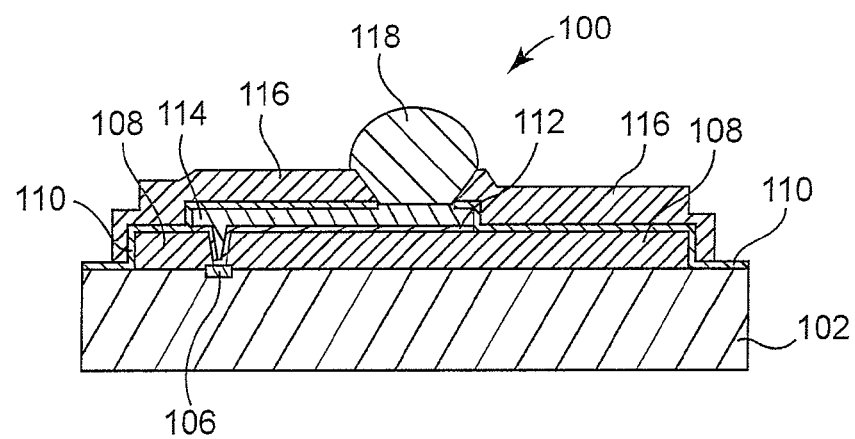
FIG. 1 illustrates a cross-sectional view of one embodiment of an integrated circuit.

FIG. 1 illustrates a cross-sectional view of one embodiment of an integrated circuit 100. Integrated circuit 100 is a wafer level package and includes a semiconductor chip 102 including circuitry (not shown) and a contact pad 106. Integrated circuit 100 includes a dielectric material layer 108, a conductive material layer 112, a redistribution line 114, a parylene material layer 110, a solder stop material layer 116, and a solder ball 118. Integrated circuit 100 illustrates only a single contact pad 106, redistribution line 114, and solder ball 118 for simplicity. In other embodiments, however, integrated circuit 100 includes any suitable number of contact pads 106, redistribution lines 114, and solder balls 118.

Contact pad 106 is electrically coupled to solder ball 118 through conductive material layer 112 and redistribution line 114. Parylene material layer 110 hermetically seals dielectric material layer 108 and redistribution line 114 and optionally dicing kerf areas of semiconductor chip 102. Parylene material layer 110 protects redistribution line 114 from oxidation and corrosion during processing. Parylene material layer 110 is applied at low process temperatures (e.g., room temperature) and can be applied on non-planar areas to provide a hermetic seal of the wafer level package.

Integrated circuit 100 includes a fan-in wafer level package. In one embodiment, semiconductor chip 102 includes a Si substrate or another suitable substrate. Contact pad 106 includes Al or another suitable contact material. Dielectric material 108 includes a polyimide or another suitable dielectric material. Conductive material layer 114 includes TiW or another suitable conductive material. Redistribution line 114 includes Cu or another suitable conductive material. Solder stop material layer 116 includes a polyimide or another suitable dielectric material.

Figure 2:
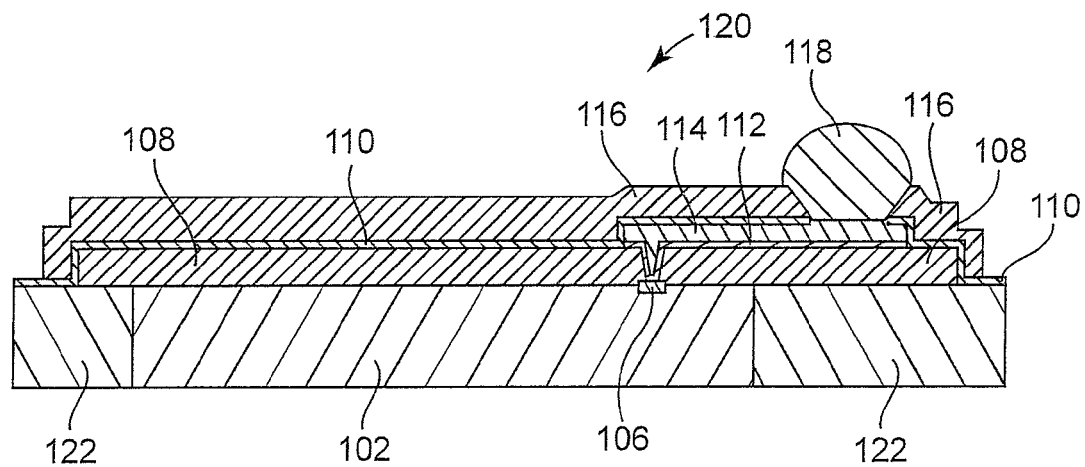
FIG. 2 illustrates a cross-sectional view of another embodiment of an integrated circuit.

FIG. 2 illustrates a cross-sectional view of another embodiment of an integrated circuit 120. Integrated circuit 120 is similar to integrated circuit 100 previously described and illustrated with reference to FIG. 1, except integrated circuit 120 includes a fan-out wafer level package instead of a fan-in wafer level package. In this embodiment, semiconductor chip 102 is laterally surrounded by a mold material 122. Mold material 122 provides a fan-out region for integrated circuit 120 where solder ball 118 is applied. Contact pad 106 is electrically coupled to solder ball 118 in the fan-out region through conductive material layer 112 and redistribution line 114.

The following FIGS. 3-11 illustrate embodiments for fabricating an integrated circuit including fan-in wafer level packaging, such as integrated circuit 100 previously described and illustrated with reference to FIG. 1. A similar fabrication process as illustrated in the following figures can be used to fabricate integrated circuits including fan-out wafer level packaging, such as integrated circuit 120 previously described and illustrated with reference to FIG. 2.

Figure 3:
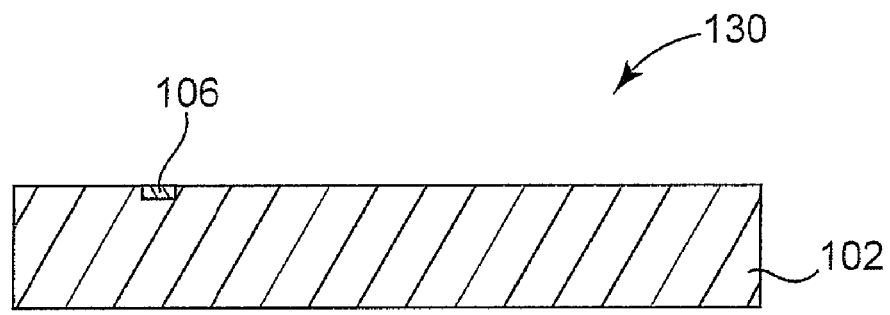
FIG. 3 illustrates a cross-sectional view of one embodiment of a preprocessed wafer.

FIG. 3 illustrates a cross-sectional view of one embodiment of a preprocessed wafer 130. Preprocessed wafer 130 includes a substrate 102 and a contact pad 106. Contact pad 106 is electrically coupled to circuitry (not shown) within substrate 102.

Figure 4:
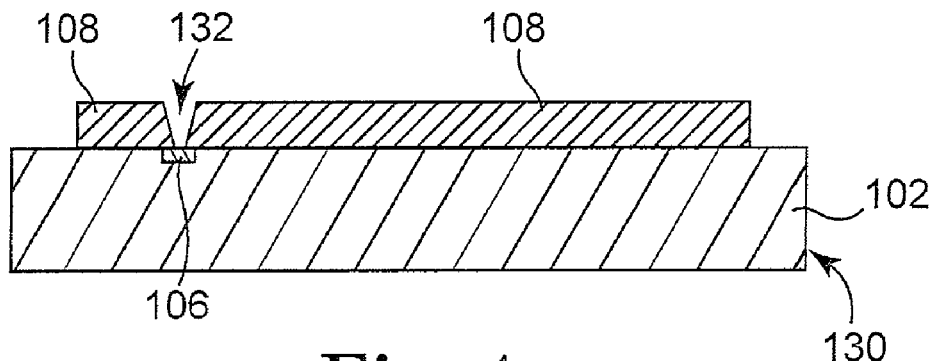
FIG. 4 illustrates a cross-sectional view of one embodiment of a preprocessed wafer and a dielectric material layer.

FIG. 4 illustrates a cross-sectional view of one embodiment of preprocessed wafer 130 and a dielectric material layer 108. A dielectric material, such as a polyimide or another suitable dielectric material is deposited over preprocessed wafer 130. The dielectric material layer is deposited using a spin-on deposition or another suitable deposition technique. The dielectric material layer is then etched to provide an opening 132 exposing at least a portion of contact pad 106 and to provide dielectric material layer 108. Opening 132 is patterned using a photolithography process or another suitable process.

Figure 5:
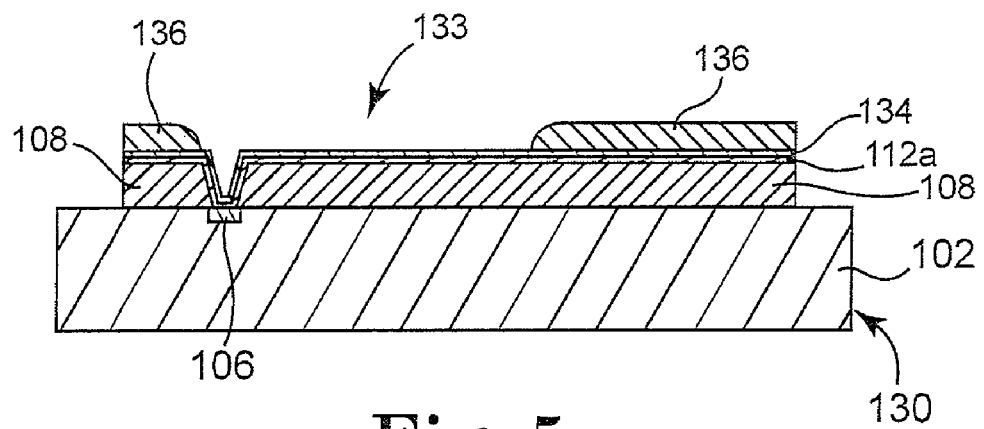
FIG. 5 illustrates a cross-sectional view of one embodiment of the preprocessed wafer, the dielectric material layer, a conductive material layer, a seed layer, and a mask layer.

FIG. 5 illustrates a cross-sectional view of one embodiment of preprocessed wafer 130, dielectric material layer 108, a conductive material layer 112a, a seed layer 134, and a mask layer 136. A conductive material, such as TiW or another suitable conductive material is conformally deposited over exposed portions of dielectric material layer 108 and contact pad 106 to provide conductive material layer 112a. Conductive material layer 112a is deposited using a sputter deposition or another suitable deposition technique. In one embodiment, conductive material layer 112a is deposited to a thickness of approximately 50 nm or another suitable thickness.

A seed material, such as Cu or another suitable seed material is conformally deposited over conductive material layer 112a to provide seed layer 134. Seed layer 134 is deposited using a sputter deposition or another suitable deposition technique. In one embodiment, seed layer 134 is deposited to a thickness of approximately 150 nm or another suitable thickness. In one embodiment, conductive material layer 112a and seed layer 134 are collectively referred to as a seed layer.

A mask material, such as photoresist or another suitable mask material is deposited over seed layer 134 to provide a mask material layer. The mask material layer is patterned and etched to provide opening 133 exposing a portion of seed layer 134.

Figure 6:
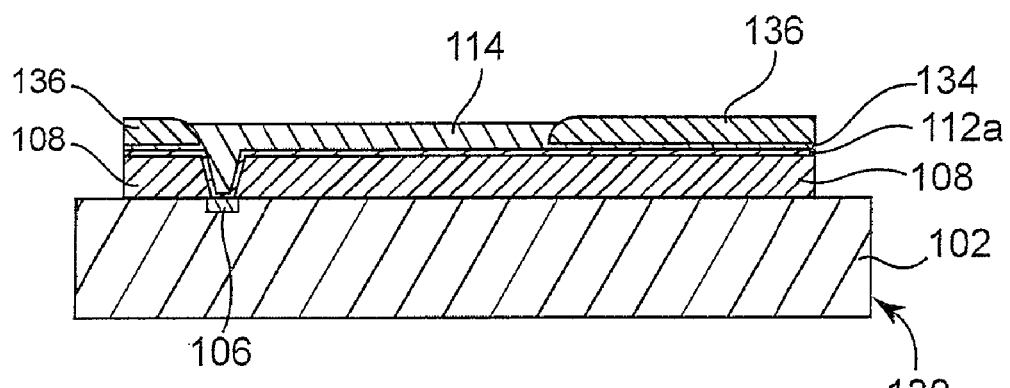
FIG. 6 illustrates a cross-sectional view of one embodiment of the preprocessed wafer, the dielectric material layer, the conductive material layer, the seed layer, a redistribution line, and the mask layer.

FIG. 6 illustrates a cross-sectional view of one embodiment of preprocessed wafer 130, dielectric material layer 108, conductive material layer 112a, seed layer 134, mask layer 136, and a redistribution line 114. In one embodiment, an electroplating process is used to deposit Cu or another suitable conducting material on exposed portions of seed layer 134 to provide redistribution line 114. In one embodiment, the Cu is electroplated to a thickness of approximately 6 μm or another suitable thickness.

Figure 7:
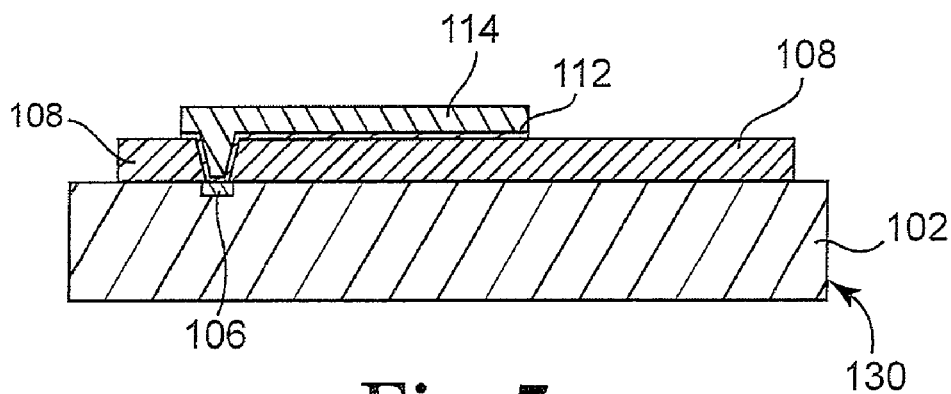
FIG. 7 illustrates a cross-sectional view of one embodiment of the preprocessed wafer, the dielectric material layer, the conductive material layer, and the redistribution line.

FIG. 7 illustrates a cross-sectional view of one embodiment of preprocessed wafer 130, dielectric material layer 108, conductive material layer 112, and redistribution line 114. Mask material layer 136 is removed to expose portions of seed layer 134. The exposed portions of seed layer 134 are etched to expose portions of conductive material layer 112a. The exposed portions of conductive material layer 112a are etched to expose dielectric material layer 108 and to provide conductive material layer 112.

Figure 8:
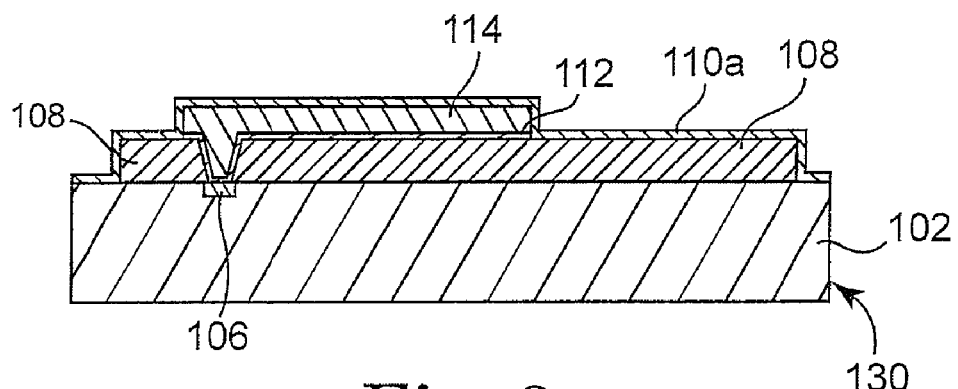
FIG. 8 illustrates a cross-sectional view of one embodiment of the preprocessed wafer, the dielectric material layer, the conductive material layer, the redistribution line, and a parylene material layer.

FIG. 8 illustrates a cross-sectional view of one embodiment of preprocessed wafer 130, dielectric material layer 108, conductive material layer 112, redistribution line 114, and a parylene material layer 110a. A parylene material is conformally deposited over exposed portions of preprocessed wafer 130, dielectric material layer 108, and redistribution line 114 to provide parylene material layer 110a. Parylene material layer 110a is deposited in the vapor phase in a chamber at a low temperature, such as room temperature. By depositing the parylene material in the vapor phase, vertical areas and small openings are coated. In one embodiment, parylene material layer 110a is deposited to a thickness of approximately 1 μm or another suitable thickness. Parylene material layer 110a is resistant against humidity and has a high electrical breakdown voltage. Parylene material layer 110a protects redistribution line 114 from oxidation and corrosion.

Figure 9:
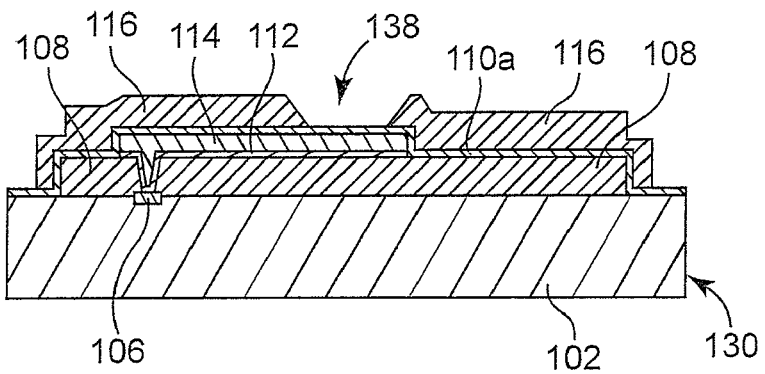
FIG. 9 illustrates a cross-sectional view of one embodiment of the preprocessed wafer, the dielectric material layer, the conductive material layer, the redistribution line, the parylene material layer, and a solder stop material layer.

FIG. 9 illustrates a cross-sectional view of one embodiment of preprocessed wafer 130, dielectric material layer 108, conductive material layer 112, redistribution line 114, parylene material layer 110a, and a solder stop material layer 116. A solder stop material, such as a polyimide or another suitable dielectric material is deposited over parylene material layer 110a to provide a solder stop material layer. The solder stop material layer is deposited using a spin-on deposition or another suitable deposition technique. The solder stop material layer is patterned and etched to provide an opening 138 exposing a portion of parylene material layer 110a. In addition, the solder stop material layer is etched at the dicing kerfs. In one embodiment, the solder stop material layer covers approximately 10-20 μm of parylene at the edges of the dicing kerfs after etching.

Figure 10:
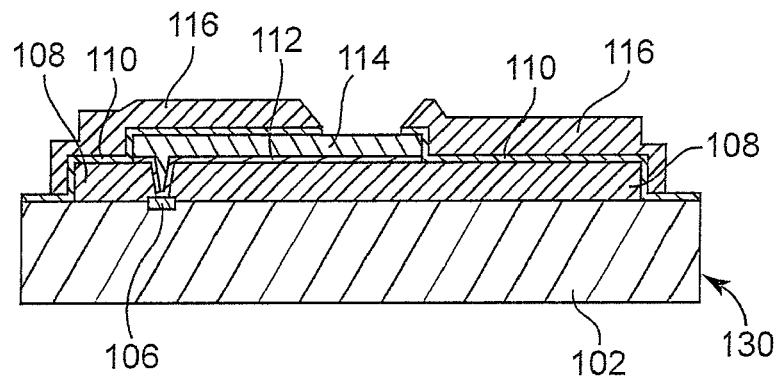
FIG. 10 illustrates a cross-sectional view of one embodiment of the preprocessed wafer, the dielectric material layer, the conductive material layer, the redistribution line, the parylene material layer, and the solder stop material layer after etching the parylene material layer.

FIG. 10 illustrates a cross-sectional view of one embodiment of preprocessed wafer 130, dielectric material layer 108, conductive material layer 112, redistribution line 114, parylene material layer 110, and solder stop material layer 116 after etching parylene material layer 110a. Exposed portions of parylene material layer 110a are etched using an $O_2$ plasma etch or another suitable etch to expose a portion of redistribution line 114. A solder ball 118 is then applied contacting the exposed portion of redistribution line 114 using a fluxing, ball apply, and reflow process to provide integrated circuit 100 previously described and illustrated with reference to FIG. 1.

Figure 11:
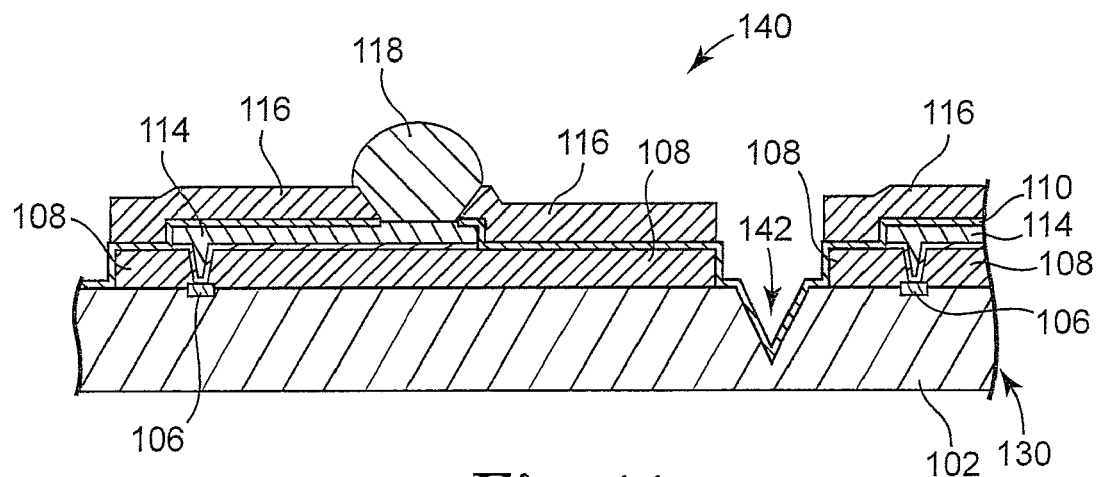
FIG. 11 illustrates a cross-sectional view of another embodiment of a wafer including wafer level packages.

FIG. 11 illustrates a cross-sectional view of another embodiment of a wafer 140 including wafer level packages. Wafer 140 includes bevel cuts at the dicing kerfs as indicated at 142. In one embodiment, parylene material layer 110 is deposited after the bevel cuts to provide hermetic sealing at the dicing kerfs.

Embodiments provide integrated circuits including fan-in or fan-out wafer level packages including a hermetic seal provided by a parylene material layer. The parylene material layer protects the redistribution lines from oxidation and corrosion during processing. In addition, the parylene material layer can be applied at low temperatures in the vapor phase to provide the hermetic seal of the wafer level package.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a substrate including a contact pad;
   a redistribution line coupled to the contact pad;
   a dielectric material layer between the substrate and the redistribution line;
   a solder ball coupled to the redistribution line;
   a parylene material layer hermetically sealing the dielectric material layer and the redistribution line, and
   a fan-out area laterally adjacent the substrate, the fan-out area comprising a mold material supporting at least a portion of the redistribution line, the dielectric material layer, and the parylene material layer,
   wherein the solder ball is within the fan-out area.

2. The integrated circuit of claim 1, further comprising:
   a solder stop material layer over the parylene material layer.

3. The integrated circuit of claim 1, wherein the integrated circuit comprises a wafer level package.

4. A wafer comprising:
   a mold material supporting a plurality of separated die, each die including a contact pad;
   a redistribution line coupled to each contact pad;
   a dielectric material layer between each die and each redistribution line;
   a solder ball coupled to each redistribution line; and
   a parylene material layer sealing each dielectric material layer and each redistribution line,
   wherein the mold material provides a fan-out area laterally adjacent each die, the fan-out area supporting at least a portion of the redistribution line, the dielectric material layer, and the parylene material layer, and
   wherein the solder ball is within the fan-out area.

5. The wafer of claim 4, further comprising:
   a solder stop material layer over each parylene material layer.

6. The wafer of claim 4, wherein each parylene material layer provides a hermetic seal.

7. The integrated circuit of claim 1, wherein a thickness of the parylene material layer is less than a thickness of the redistribution line and less than a thickness of the dielectric material layer.

8. The integrated circuit of claim 2, wherein a thickness of the parylene material layer is less than a thickness of the solder stop material layer.

9. The wafer of claim 4, wherein a thickness of each parylene material layer is less than a thickness of each redistribution line and less than a thickness of each dielectric material layer.

10. The wafer of claim 5, wherein a thickness of each parylene material layer is less than a thickness of each solder stop material layer.

* * * * *